(12) United States Patent
Kamitani

(10) Patent No.: US 7,439,748 B2
(45) Date of Patent: *Oct. 21, 2008

(54) METHOD AND APPARATUS FOR MEASURING HIGH-FREQUENCY ELECTRICAL CHARACTERISTICS OF ELECTRONIC DEVICE, AND METHOD FOR CALIBRATING APPARATUS FOR MEASURING HIGH-FREQUENCY ELECTRICAL CHARACTERISTICS

(75) Inventor: Gaku Kamitani, Kyoto-fu (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/537,111

(22) Filed: Sep. 29, 2006

(65) Prior Publication Data

US 2007/0029990 A1    Feb. 8, 2007

Related U.S. Application Data

(63) Continuation of application No. PCT/JP04/04882, filed on Apr. 2, 2004, and a continuation of application No. PCT/JP2004/019087, filed on Dec. 21, 2004.

(51) Int. Cl.
 *G01R 35/00* (2006.01)
 *G01R 27/04* (2006.01)
 *G01R 23/16* (2006.01)
(52) U.S. Cl. .................... 324/601; 324/76.22; 324/639
(58) Field of Classification Search ................ 324/638, 324/601, 76.22
 See application file for complete search history.

(56) References Cited

U.S. PATENT DOCUMENTS 3,796,948 A * 3/1974 Wentworth ................. 324/630
6,593,753 B2 * 7/2003 Scott et al. .................. 324/637
6,838,885 B2 * 1/2005 Kamitani .................... 324/601
6,960,920 B2 * 11/2005 Kamitani .................... 324/601
7,064,555 B2 * 6/2006 Jamneala et al. ............ 324/601
2004/0100276 A1 * 5/2004 Fanton ....................... 324/601

FOREIGN PATENT DOCUMENTS

JP    6-34686    2/1994
JP    10-197577    7/1998

OTHER PUBLICATIONS

Written Opinion.

* cited by examiner

*Primary Examiner*—Vincent Q. Nguyen
*Assistant Examiner*—Jeff Natalini
(74) *Attorney, Agent, or Firm*—Ostrolenk, Faber, Gerb & Soffen, LLP

(57) ABSTRACT

A signal conductor whose first end is an open end, and a ground conductor are connected to associated measurement ports of a network analyzer. A short standard is connected between the signal conductor and the ground conductor at least three points in the longitudinal direction of the signal conductor, and electrical characteristics are measured, thereby calculating error factors of a measurement system including a transmission line. An electronic device to be measured is connected between the signal conductor and the ground conductor, and an electrical characteristic is measured. The error factors of the measurement system are removed from the measured value of the electronic device to be measured, thereby obtaining a true value of the electrical characteristic of the electronic device. Accordingly, a highly accurate high-frequency electrical characteristic measuring method, using a reflection method, that is not affected by connection variations can be implemented.

15 Claims, 6 Drawing Sheets

MEASURING FIXTURE

CALIBRATION PLANE

METHOD AND APPARATUS FOR MEASURING HIGH-FREQUENCY ELECTRICAL CHARACTERISTICS OF ELECTRONIC DEVICE, AND METHOD FOR CALIBRATING APPARATUS FOR MEASURING HIGH-FREQUENCY ELECTRICAL CHARACTERISTICS

CROSS-REFERENCE TO RELATED APPLICATIONS

This is a continuation of PCT/JP2004/004882 filed Apr. 2, 2004 and PCT/JP2004/019087 filed Dec. 21, 2004, both incorporated by reference.

BACKGROUND OF THE INVENTION

1. Technical Field

The present invention relates to a method and apparatus for measuring high-frequency electrical characteristics of a two-terminal electronic device, such as a chip inductor, a chip capacitor, a chip resistor, or the like. More specifically, the present invention relates to a method for correcting a measurement error in measuring the impedance or the Q-value of the electronic device with a reflection method using a measuring device, such as a network analyzer or the like.

2. Background Art

To measure high-frequency electrical characteristics of an impedance device, such as a surface-mounted chip inductor or a surface-mounted chip capacitor, using a network analyzer, there is a measurement method in which a planar transmission line (such as a microstrip line or a coplanar waveguide) is connected to the network analyzer via coaxial cables or the like. It is impossible to directly connect the coaxial cables to the electronic device. Therefore, the electronic device is brought into contact with the planar transmission line to make a measurement. In this case, in order to obtain true values of a scattering parameter matrix of the impedance device serving as a test object, it is necessary to identify error factors of a measurement system and to remove the effects of the error factors from the measurement results. This is referred to as correction or calibration.

In the measurement using a network analyzer, as shown in non-patent document 1, Application Note 1287-9; In-Fixture Measurements Using Vector Network Analyzers (©1999 Hewlett-Packard Company), TRL (Through-Reflection-Load) calibration and SOLT (Short-Open-Load-Through) calibration are known as techniques for removing errors of the measurement system.

FIGS. 1 and 2 show respectively SOLT and TRL measurement systems using a network analyzer and the corresponding error models for use in SOLT calibration and TRL calibration.

An electronic device 1 serving as a test object is connected to a transmission line provided on the top surface of a measuring fixture 2. Two ends of the transmission line on the measuring fixture 2 are connected to measurement ports of the network analyzer, which is not shown, via coaxial cables 3.

In the error model of SOLT calibration, $S_{11A}$, $S_{21A}$, $S_{12A}$ and $S_{22A}$ are scattering parameters of the transmission line including the test object, $E_{DF}$, $E_{RF}$, and $E_{SF}$ are scattering parameters on one measurement port side, and $E_{LF}$ and $E_{TF}$ are scattering parameters on the other measurement port side.

In the error model of TRL calibration, $S_{11A}$, $S_{21A}$, $S_{12A}$ and $S_{22A}$ are scattering parameters of the test object, $e_{00}$, $e_{10}$, $e_{01}$ and $e_{11}$ are scattering parameters on one measurement port side, and $f_{00}$, $f_{10}$, $f_{01}$ and $f_{11}$ are scattering parameters on the other measurement port side.

In order to identify error factors, it is necessary to fix at least three types of devices (standards) whose scattering parameters are known to a test object measuring plane and make measurements. Traditionally, opens, shorts, and terminations (loads) (=50Ω) are often used. Since these standards can be implemented in a coaxial environment, this method, which is referred to as SOLT calibration, is widely used. In SOLT calibration, as shown in FIG. 3, three types of connectors 4 including a short (0Ω), an open (∞Ω), and a termination (50Ω) are used, and the ports are directly connected to each other to achieve a through state.

However, in the case of SOLT calibration, it is very difficult to implement these standards in environments other than the coaxial environment, and the standards necessary for calibration cannot be fabricated in the form of a chip device. For example, a planar transmission line for use in measuring a surface-mounted device is, unlike a waveguide or a coaxial transmission line, unable to achieve a satisfactory "open" or "termination", and it is thereby practically impossible to perform SOLT calibration. Also, in general, measured values obtained by measurements are not characteristics of the test object 1 alone, but are composite characteristics of the test object 1 and the measuring fixture 2 to which the test object is connected. It is thus impossible to measure characteristics of the test object alone.

TRL calibration employs, as shown in FIG. 4, instead of device-shaped standards that are difficult to realize, a (through) transmission line 5a whose ports are directly connected to each other, a total reflection (reflection=normally shorted) transmission line 5b, and several other types of transmission lines 5c and 5d of different lengths as standards. With regard to the transmission lines 5a to 5d, it is relatively easy to fabricate transmission lines whose scattering parameters are known. Also, if the total reflection is achieved by shorting, it is relatively easy to estimate characteristics thereof. Therefore, these transmission lines are sufficient to perform calibration. Basically, it is possible to measure the characteristics of the test object 1 alone.

In this example, the through transmission line 5a is a so-called zero-through. To measure the test object, the test object is connected in series with the measuring fixture 2 whose length is greater than the through transmission line 5a by the length of the test object, and a measurement is made.

However, when TRL calibration is applied to a surface-mounted device serving as a test object, the following problems occur.

1) With regard to the transmission lines (several types of lines, including reflection and through lines) 5a to 5d serving as the standards, it is necessary that all the error factors generated in connections between coaxial connectors 3 and the transmission lines 5a to 5d be equivalent. However, even when the same type of connectors are used as the standards, characteristics of the standards vary greatly when the standards are connected to a measuring device, thereby generating calibration errors. It is practically impossible to perform TRL calibration near a millimeter-wave band.

2) In order to solve this problem, the coaxial connectors 3 are common among the transmission lines 5a to 5d, and coaxial pins are in contact and connected to the transmission lines serving as the standards, thereby avoiding the effects of variations in connector measurements. Structurally, however, it is difficult to ensure a sufficient pressing load at the connections, and hence the coaxial pins may be damaged. Since the connections are unstable, calibration becomes also often unstable. The higher the measurement frequency, generally the thinner the transmission lines and the coaxial pins. Depending on the positioning repeatability thereof, measurement variations may become larger.

3) Since it is difficult to determine, in the calibration operation, whether the measurement is properly performed in the calibration, there may be a waste of time, such as a failure, e.g., poor contact at the time of the calibration, recognized upon a measurement of a test object after having completed the time-consuming calibration operation.

Patent document 1, Japanese Unexamined Patent Application Publication No. 6-34686, discloses a method for calibrating a network analyzer having two test terminals to be connected to a test object via a strip line. That is, a first calibration measurement is made to measure transmission and reflection parameters of the microstrip line whose propagation constant is unknown, which is connected between the two test terminals in a reflection-free manner. Three further calibration measurements are made using the same line and three calibration standards realized with reflection-symmetric and reciprocal discontinuous objects disposed at three different positions on the line.

That is, the three types of standards are realized by changing the state of the transmission line to three states. This way, the standards are connected only once. With this method, compared with TRL calibration, the number of times the standards are connected is reduced, and hence measurement errors in the calibration operation are reduced in number.

However, in the actual measurement of a test object, it is necessary to remove the strip line employed as the standard, and to again connect a strip line (fixture) to which the test object can be connected. Needless to say, characteristics of a reconnected portion change, resulting in measurement errors.

It is practically difficult to connect the strip line between the two test terminals in a reflection-free manner. Reflection parameters of portions in which the test terminals are connected to the strip line may cause errors.

Measured values obtained by connecting a test object are not characteristics of the test object alone, but are composite characteristics of the test object and the strip line to which the test object is connected. It is thus impossible to measure the characteristics of the test object alone.

SUMMARY OF THE INVENTION

The present invention solves the foregoing problems in TRL calibration and SOLT calibration and provides a highly accurate method for measuring high-frequency electrical characteristics of an electronic device, which is not affected by characteristic variations in connections.

The present invention also provides a highly accurate apparatus for measuring high-frequency electrical characteristics of an electronic device.

The present invention further provides a highly accurate method for calibrating a high-frequency electrical characteristic measuring apparatus.

An embodiment of the invention provides a method for measuring high-frequency characteristics of an electronic device. The method includes a step of preparing a transmission line whose electrical characteristics per unit length are known, the transmission line including a signal conductor whose first end is an open end and a ground conductor; a step of connecting a second end of the signal conductor and the ground conductor to associated measurement ports of a measuring device; a step of measuring, at least three points in the longitudinal direction of the signal conductor, an electrical characteristic in a connection state where the signal conductor is connected to the ground conductor; a step of obtaining error factors of a measurement system including the transmission line on the basis of measured values in the connection state and the electrical characteristics of the transmission line; a step of connecting the electronic device to be measured between the open end of the signal conductor and the ground conductor and measuring an electrical characteristic; and a step of removing the error factors of the measurement system from a measured value of the electronic device to be measured and obtaining a true value of the electrical characteristic of the electronic device to be measured.

According to another embodiment of the present invention, a reflection method includes the steps of connecting a test object between a signal conductor and a ground conductor of a transmission line serving as a measuring fixture, measuring a reflection parameter of the test object, and obtaining, on the basis of the measured reflection parameter, electrical characteristics including an impedance, quality parameter, or the like; and further, includes a technique for removing errors of a measurement system including the transmission line and the like. This embodiment is based on the knowledge that, in the measurement of errors of the measurement system, it is possible to achieve a satisfactory reflection state of the transmission line.

In a preferred example of the calibration method according to the present invention (hereinafter referred to as RRR calibration), a short standard is employed as a calibration standard (standard). This is because, since a short-circuited state is substantially equivalent to a total reflection state, the effects of a terminated end of the signal conductor can be avoided. In the frequency range where the transmission line serving as an object operates in TEM single mode, characteristics in the short-circuited state are substantially not affected by a dielectric, and it is possible to estimate electrical characteristics of the transmission line with high accuracy using an electromagnetic field simulation.

In general, a parameter that limits the accuracy of simulated transmission line characteristics is a dielectric constant. It has been confirmed that there is only a negligible change in the calculation results of the reflection characteristics in a short-circuited state when the dielectric constant is changed. It can be said that there is no harm in assuming that the simulation results are physical true values to be used in calibration. When the width of the transmission line is sufficiently smaller than the wavelength of a measured signal, it can be regarded that no big error will be introduced by using −1 (reflection parameter of an ideal short) as a short characteristic.

An outline of RRR calibration according to the present invention will now be described.

Calibration Step: Measurement in Short-Circuited State

In RRR calibration, a transmission line including a signal conductor whose electrical characteristics are uniform in the longitudinal direction and whose first end is an open end is shorted at least three points on the transmission line, thereby identifying error factors of a measurement system. In order to short the transmission line, for example, a short standard is connected between the signal conductor and the ground conductor. Specifically, the short standard is connected to a test object measurement position, and a measurement is made. Next, the short standard is connected to a point spaced away from the test object measurement position by $L_1$, and a measurement is made. Then, the short standard is connected to a point spaced away from the test object measurement position by $L_2$, and a measurement is made. If the characteristics of the transmission line are also unknown, a fourth measurement may be made at another point.

The short standard refers to electrically shorted devices in general. The short standard is not limited to chip devices and includes metal pieces or tools. Preferably, the short standard has a short length of contact in the longitudinal direction of the transmission line, such as provided by the edge of a knife. If the short standard is ideal, the reflection parameter is −1 (total reflection). In reality, however, the short standard has a certain amount of inductance, and it is thus necessary that the inductance be known. In a microwave band, compared with an open state, it is generally relatively easy to achieve an almost ideal short-circuited state. If high measurement accuracy is required, the inductance of the short standard can be obtained with a simple simulation or the like.

If the electrical characteristics of the transmission line are known, the error factors of the measurement system can be obtained by making measurements in the short-circuited state at three or more points.

In contrast, if the electrical characteristics of the transmission line are unknown, not only the error factors of the measurement system, but also the electrical characteristics of the transmission line can be obtained by making measurements in the short-circuited state at four or more points.

Measurement Step: Measurement of Test Object

An electronic device serving as a test object is connected between the signal conductor and the ground conductor of the transmission line, and the electrical characteristics of the test object are measured.

Using the measured electrical characteristics of the test object and the error factors obtained in the calibration step, a true value of the electrical characteristic of the test object can be calculated.

In the above description, the signal conductor and the ground conductor are shorted in the calibration step using the short standard. However, it is not always necessary to short the signal conductor and the ground conductor. It is sufficient that the signal conductor be connected to the ground conductor so as to achieve some sort of a reflection state.

For example, a terminating resistor whose impedance is close to the characteristic impedance is connected between the open end of the signal conductor and the ground conductor, and, in this state, an appropriate calibration standard is connected to at least three points on the transmission line, thereby performing the calibration operation. In this case, most signals are not reflected but rather are absorbed at the open end. Thus, even when a chip device whose transmission parameter is somewhat large is used as the calibration standard, errors are small, and accuracy required for calibration can be achieved.

The RRR calibration implemented in the above-described manner may have the following features.

(1) Calibration and measurement are performed on one and the same transmission line.

In TRL calibration, transmission lines of different lengths serving as standards are necessary, and it is also necessary that connections between the transmission lines and coaxial cables have equivalent electrical characteristics. However, in the RRR calibration, one and the same transmission line is employed not only in calibration, but also in measurement. It is thus unnecessary to reconnect the transmission line, and the RRR calibration is not affected by variations in characteristics of the transmission line, the connectors, and the connections.

(2) Since the RRR calibration is a measurement method using reflection, it is sufficient for a measuring device to have only one port. Such a measuring device is inexpensive. Since the calibration procedure needs to be done for only one port, it is less time-consuming.

(3) The closer the electrical characteristics of the test object to the characteristic impedance of the transmission line, the higher the measurement accuracy.

(4) Not only the measurement of a two-terminal electronic device, but also the measurement of electrical characteristics of a high-frequency device, such as an antenna, that used to be difficult to measure with a known measurement method, can be performed.

(5) The preferred length of the transmission line for the measuring fixture is determined by the lower limit of the frequencies to be measured. In order to handle low frequencies, a long transmission line is used. However, a short transmission line is sufficient to handle high frequencies.

(6) Measurement for calibration are made by connecting the calibration standard (e.g., the short standard) to a few points on the transmission line.

The number of points at which the measurement using the calibration standard is performed and how far they are away from the test object measurement position are determined by the measurement frequency bandwidth and the upper frequency limit.

(7) When the measurement using the calibration standard is performed at four or more points on the transmission line, the characteristics of the transmission line can also be obtained.

If the characteristics of the transmission line are known, the error factors of the measurement system can be obtained by connecting the calibration standard to three points. If the calibration standard is connected to four or more points, not only the error factors of the measurement system, but also the characteristics of the transmission line (dielectric constant, loss parameter, etc.) can be obtained. Therefore, even when the dielectric constant or loss parameter of a dielectric material for use in the transmission line fixture is unknown or even when the characteristics of a dielectric material in each lot vary, the characteristics of the transmission line fixture to be used can be accurately obtained, and highly accurate calibration can be performed without errors.

In general, transmission line fixtures made of a base material such as Teflon® or alumina have electrical characteristics that vary only slightly, and it is easy to obtain the physical true values of the electrical characteristics. However, these transmission line fixtures are expensive. In contrast, transmission line fixtures made of a base material including a general resin such as an epoxy resin or the like are inexpensive. However, material characteristics of these transmission line fixtures vary greatly, and the dielectric constant and loss parameter thereof also vary. In such a case, the calibration standard is connected to four or more points to obtain transmission line characteristics. In this way, the electrical characteristics of a test object can be measured with high accuracy without being affected by variations in the transmission line characteristics.

To short the signal conductor and the ground conductor of the transmission line, the short standard is connected to the transmission line. However, due to high frequencies, the influence of the residual inductance of the short standard may be great, and the signal conductor and the ground conductor may not be sufficiently shorted (the total reflection cannot be achieved).

In this case, it is preferable that the calibration standard be brought near (not in contact with) the transmission line, whereby the stray capacitance generated between the transmission line and the calibration standard and the residual inductance of the calibration standard will form a series resonance state.

In the series resonance state, the impedance of a portion connected to the calibration standard is 0Ω, that is, an ideal short-circuited state is achieved. In other words, even at high frequencies where a satisfactory short standard is not realized, the same advantage as that of using a satisfactory short standard can be achieved.

In the case where a capacitor with a very small capacitance is used as the calibration standard, the capacitor may be brought into contact (completely connected) with the transmission line to produce series resonance.

It is preferable to use, as the transmission line of the present invention, a transmission line including a signal conductor and a ground conductor disposed on the same plane. In this way, when performing calibration using a calibration standard or measurement using a test object, the calibration standard or the test object can be easily connected to the signal conductor and the ground conductor at the same time. Since the calibration standard or the test object can be vertically pressed against the transmission line at the time of calibration or measurement, a sufficient pressing load can be easily ensured, and hence the contact easily becomes stable.

Specifically, a coplanar waveguide or a slot line may be used as the transmission line. The coplanar waveguide includes a signal conductor and a ground conductor having the signal conductor therebetween, and the signal conductor and the ground conductor are disposed on the same plane. The coplanar waveguide is suitable for the measurement of high-frequency characteristics up to 10 GHz.

In contrast, the slot line includes a signal conductor and a ground conductor, which are disposed on the same plane with a space therebetween. The slot line is suitable for the measurement of high-frequency characteristics at 10 GHz or higher.

It is preferable that the calibration standard be connected to positions at which the phase difference between the positions is between 70° and 145°.

In order to perform highly accurate calibration, it is preferable that pieces of calibration data be apart from each other as far as possible. In RRR calibration where different pieces of calibration data are obtained depending on the reflection phase based on the calibration standard, preferably, for the sake of calibration, the phase difference between the positions at which the calibration standard is connected is between 70° and 145° in order to enhance the calibration accuracy. When the phase difference between the connection positions is set as described above, the frequency range that can be handled by a pair of calibration standards becomes quite narrow, though the calibration accuracy becomes high. However, when the setting of the positions at which the calibration standard is connected is very easy, and when the measured data in the calibration is put to full use, the number of times the calibration standard is measured is not greatly increased, even in the case of broadband measurement, which thereby presents no practical problem.

Other features and advantages of the present invention will become apparent from the following description of embodiments of the invention which refers to the accompanying drawings.

DETAILED DESCRIPTION OF EMBODIMENTS OF THE INVENTION

Hereinafter, RRR calibration according to the present invention will be illustrated with reference to embodiments.

Embodiment 1

FIGS. 5 to 8 show a first embodiment according to the present invention.

—Calibration Standard in RRR Calibration—

In RRR calibration, a calibration standard to be measured is a short standard 10 in all cases, and a measuring fixture 11 (transmission line 12) to be used is the same fixture in all cases.

Figure 1:
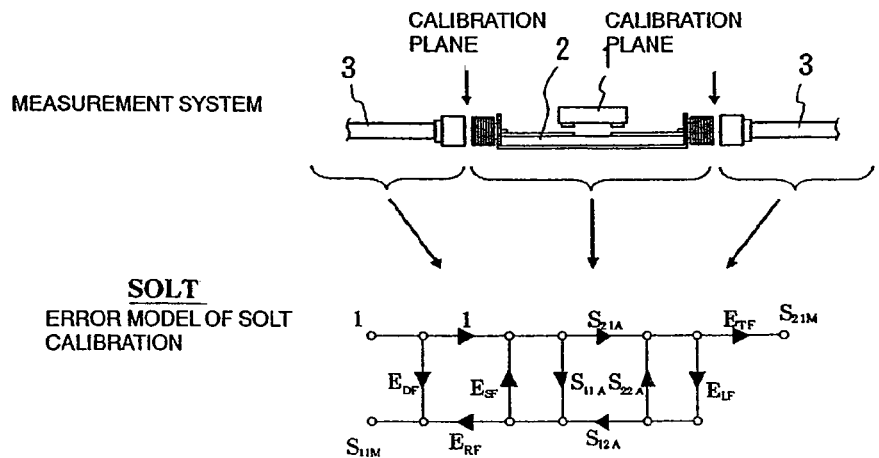
FIG. 1 is a diagram showing a measurement system using a network analyzer and an error model of SOLT calibration.
Figure 2:
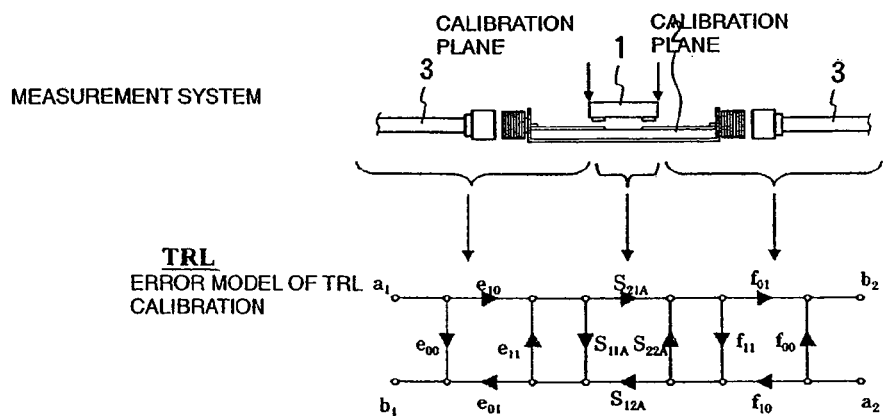
FIG. 2 is a diagram showing a measurement system using a network analyzer and an error model of TRL calibration.
Figure 3:
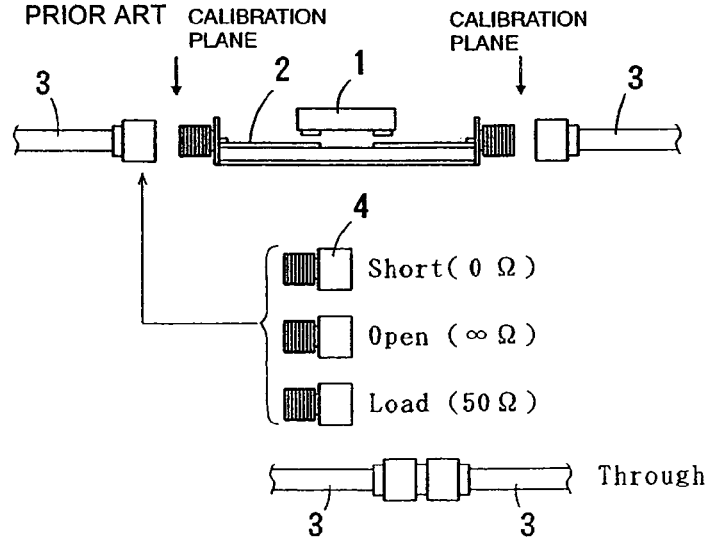
FIG. 3 is a diagram showing SOLT calibration.
Figure 4:
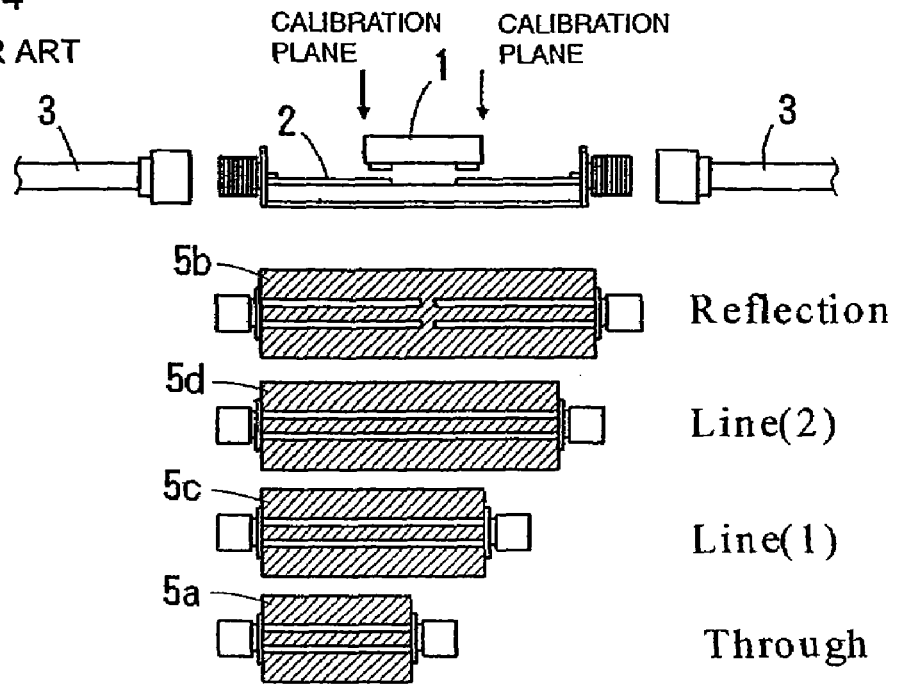
FIG. 4 is a diagram showing TRL calibration.
Figure 5:
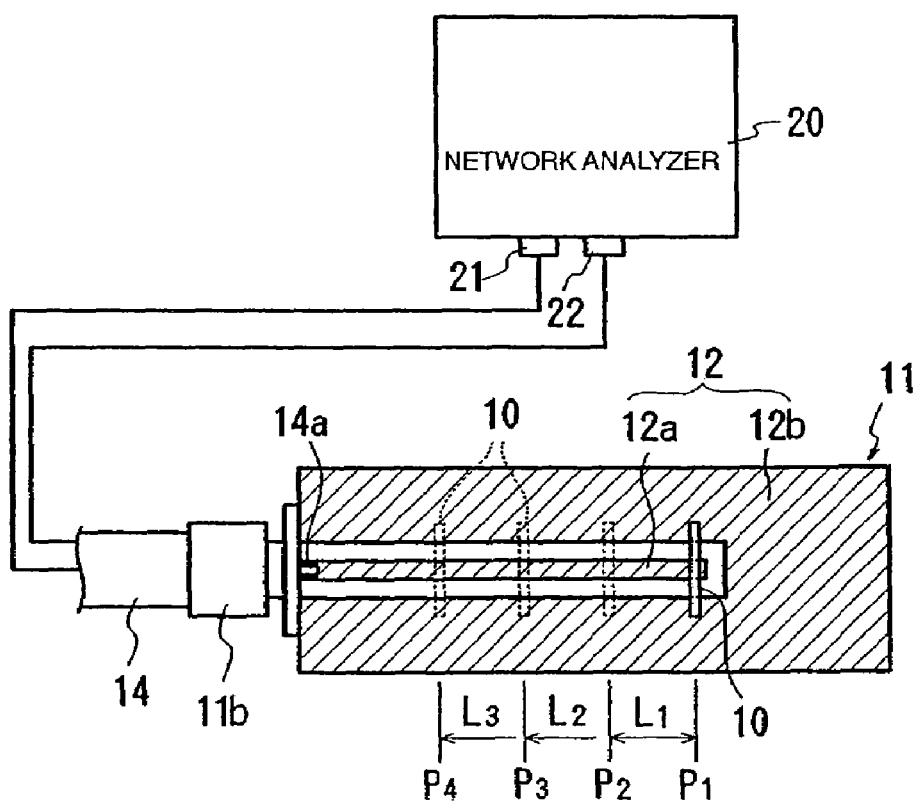
FIG. 5 is a plan view of a high-frequency electrical characteristic measuring apparatus showing a first embodiment of RRR calibration according to the present invention.
Figure 6:
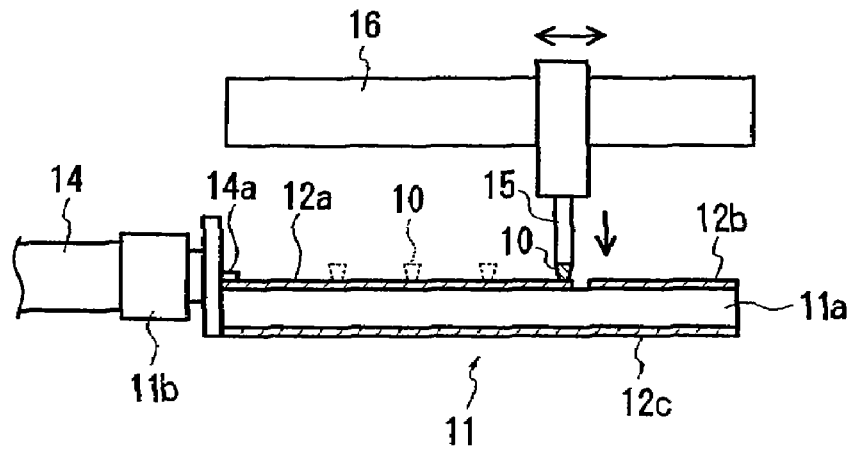
FIG. 6 is a front view of the high-frequency electrical characteristic measuring apparatus in the calibration shown in FIG. 5.

Here, a description is given using a coplanar waveguide (hereinafter referred to as CPW) serving as the measuring fixture 11 as an example. The measuring fixture 11 includes, as shown in FIGS. 5 and 6, a transmission line including a signal conductor 12a and a ground conductor 12b on the top surface of a fixture board 11a. The measuring fixture 11 further includes a ground conductor 12c disposed on the back surface of the fixture board 11a. A first end of the signal conductor 12a is an open end, and a second end is connected to a connector 11b. The ground conductor 12b is formed to have a substantially U shape so as to surround, with a space therebetween, two sides of the signal conductor 12a in the width direction and the open end of the signal conductor 12a. The connector 11b is connected to a coaxial cable 14 and to measurement ports 21 and 22 of a network analyzer 20, which is an example of a measuring device. A signal line 14a of the coaxial cable 14 is fixed by soldering, welding, or the like to the signal conductor 12a in order to eliminate connection variations. The measurement ports 21 and 22 are connected via the coaxial cable 14 to the signal conductor 12a and the ground conductor 12b, respectively.

As shown in FIG. 6, a pusher 15 for pressing the short standard 10 against the transmission line 12 and a mechanism 16 for allowing the pusher 15 to freely move along the transmission line 12 are provided above the measuring fixture 11. A knife-edge-shaped conductor fixed to the tip of the insulating pusher 15 is used as the short standard 10.

When it is only necessary to measure scattering parameters with reference to the characteristic impedance of the transmission line, the characteristic impedance of the transmission line need not be known. However, in order to measure the impedance or the like, it is necessary that the characteristic impedance of the transmission line be known. This may be obtained with a known method, such as calculating the impedance with a simulation or by using a value actually measured with a time domain reflectory method, for example.

—Connection and Measurement of Short Standard—

The short standard 10 is connected to a point at which an electrode is connected to measure a test object (measurement point 1 in FIG. 5: P1, hereinafter referred to as a "test object measurement point"), and thereafter a measurement is made, where $S_{11M1}$ is the measurement result. Let $\Gamma_{A1}$ be a true value of a reflection parameter at the measurement point. $\Gamma_{A1}$ is a true value of the short standard. When the size of the short standard 10 in the longitudinal direction of the transmission line 12 is sufficiently smaller than the wavelength of a measured signal, $\Gamma_{A1}$ is set to $-1$. Otherwise, an estimated value of the true value shall be obtained by a simulation or the like.

Next, the short standard 10 is connected to a position on the signal conductor 12a distant from the test object measurement point by $L_1$ toward the port 1 (connector 11b; see FIG. 7) (measurement point 2: P2), and thereafter a measurement is made, where $S_{11M1}$ is the measurement result. In this case, $\Gamma_{A2}$ is the true value of the reflection parameter of the short standard 10 at the measurement point 2. Let the test object measurement point be a reference plane, and the true value of the reflection parameter is expressed as shown in equation 1. Because an electromagnetic wave entering the port 1 is completely reflected by the short standard 10, the distance of the wave transmitted through the transmission line is shorter by $2L_1$ in a round trip than that in the case where the short standard 10 is connected to the test object measurement point. Here, $\alpha$ is the transmission degree [U/mm] of the transmission line per unit length, $\beta$ is a phase constant [rad/mm] of the transmission line, and $\Gamma_{A2}$ is the true value of the short standard 10 connected to the measurement point 2 with respect to the test object measurement point serving as the reference plane:

$$\Gamma_{A2}=\Gamma_{A1}\alpha^{-2L_1}\exp(j2\beta L_1) \quad [\text{Eq. 1}]$$

Then, the short standard 10 is connected to a position on the signal conductor 12a distant from the test object measurement point by $L_2$ toward the port 1 (measurement point 3: P3), and thereafter a measurement is made, where $S_{11M3}$ is the measurement result. As in the case of the measurement point 2, let the test object measurement point be the reference plane, and the true value of the reflection parameter is expressed as shown in equation 2:

$$\Gamma_{A3}=\Gamma_{A1}\alpha^{-2L_2}\exp(j2\beta L_2) \quad [\text{Eq. 2}]$$

In equations 1 and 2, as is clear from the fact that the transmission degree of the transmission line is expressed in terms of negative power, $\Gamma_{A2}$ and $\Gamma_{A3}$ may exceed one. Normally, there is no short standard whose reflection parameter exceeds one. However, the above state is generated since the test object measurement point serves as the reference plane in equations 1 and 2, and this is not abnormal.

When the transmission line characteristics $\alpha$ and $\beta$ are unknown, a fourth measurement is made by connecting the short standard 10 to a position on the transmission line distant from the measurement point 1 by $L_3$ toward the port 1 (measurement point 4: P4), where $S_{11M4}$ is the measurement result. As in the case of the measurement point 2, let the measurement point 1 be the reference plane, and the true value $\Gamma_{A4}$ of the reflection parameter at the measurement point 4 is expressed as in equation 3:

$$\Gamma_{A4}=\Gamma_{A1}\alpha^{-2L_3}\exp(j2\beta L_3) \quad [\text{Eq. 3}]$$

Now, in the following equation, let $\xi$ be an equation including $\alpha$ and $\beta$, where $\xi$ physically denotes a transmission parameter of the transmission line per unit length:

$$\xi=\alpha^{-2}\exp(j2\beta) \quad [\text{Eq. 4}]$$

Using equation 4, equations 1 to 3 can be rewritten as equations 5 to 7, respectively:

$$\Gamma_{A2}=\Gamma_{A1}\xi^{L_1} \quad [\text{Eq. 5}]$$

$$\Gamma_{A3}=\Gamma_{A1}\xi^{L_2} \quad [\text{Eq. 6}]$$

$$\Gamma_{A4}=\Gamma_{A1}\xi^{L_3} \quad [\text{Eq. 7}]$$

As has been described above, when the transmission line characteristics $\xi$ are unknown, not only error parameters, but also the transmission line characteristics $\xi$ can be obtained by shorting the transmission line at four points using the short standard.

The transmission line characteristics $\xi$ include two unknown values, namely, the transmission degree $\alpha$ and the phase parameter $\beta$. Since the transmission line characteristics $\xi$ are represented by a complex number in which a real number portion corresponds to the transmission degree $\alpha$ and an imaginary number portion corresponds to the phase parameter $\beta$, the transmission line characteristics $\xi$ can be obtained as one unknown value.

For the sake of the subsequent calculations, it is preferable that the distances $L_1$, $L_2$, and $L_3$ from the test object measuring position for measuring the short standard satisfy one of the following relationships:

$$L_1:L_2:L_3=1:2:3$$

$$L_1:L_2:L_3=1:2:4$$

When the distances $L_1$, $L_2$, and $L_3$ satisfy one of the above relationships, the transmission line characteristics can be explicitly calculated using the following equation. When the distances $L_1$, $L_2$, and $L_3$ do not satisfy either of the above relationships, the transmission line characteristics cannot be calculated using the following equation, and it is thus necessary to obtain the transmission line characteristics by iterative calculations or the like.

When the positions $L_1$, $L_2$, and $L_3$ for measuring the short standard satisfy the relationship $L_1:L_2:L_3=1:2:3$, $\xi$ can be obtained using equation 8:

$$\xi = [[\{(S_{11M3}^2 + (2S_{11M1} - 4S_{11M2})S_{11M3} + 4S_{11M1}S_{11m2} - 3S_{11M1}^2)S_{11M4}^2 +$$

$$((2S_{11M2} - 4S_{11M1})S_{11M3}^2 + (4S_{11M2}^2 - 4S_{11M1}S_{11M2} + 4S_{11M1}^2)S_{11M3} -$$

$$4S_{11M1}S_{11M2}^2 + 2S_{11M1}^2 S_{11M2})S_{11M4} + (4S_{11M1}S_{11M2}^2 - 3S_{11M2}^2)S_{11M3}^2 +$$

$$(2S_{11M1}S_{11M2}^2 - 4S_{11M1}^2 S_{11M2})S_{11M3} + S_{11M1}^2 S_{11M2}^2 \}^{1/2} +$$

$$(S_{11M3} - 2S_{11M2} + S_{11M1})S_{11M4} + (S_{11M2} - 2S_{11M1})S_{11M3} + S_{11M1}S_{11M2}]/$$

$$((2S_{11M2} - 2S_{11M1})S_{11M4} + (2S_{11M1} - 2S_{11M2})S_{11M3})]^{1/L1}$$

[Eq. 8]

In contrast, when the positions $L_1$, $L_2$, and $L_3$ satisfy the relationship $L_1:L_2:L_3=1:2:4$, $\xi$ can be obtained using equation 9:

$$\xi = [[\{(S_{11M3}^2 - 2S_{11M2}S_{11M3} - 3S_{11M2}^2 + 8S_{11M1}S_{11M2} - 4S_{11M1}^2)S_{11M4}^2 +$$

$$(-2S_{11M2} - S_{11M3}^2 + (4S_{11M2}^2 - 4S_{11M1}S_{11M2} + 4S_{11M1}^2)S_{11M3} -$$

$$4S_{11M1}S_{11M2}^2 + 2S_{11M1}^2 S_{11M2})S_{11M4} + (4S_{11M1}S_{11M2}^2 - 3S_{11M2}^2)S_{11M3}^2 +$$

$$(2S_{11M1}S_{11M2}^2 - 4S_{11M1}^2 S_{11M2})S_{11M3} + S_{11M1}^2 S_{11M2}^2 \}^{1/2} +$$

$$(S_{11M3} - 2S_{11M3} - S_{11M2})S_{11M4} - (S_{11M1}S_{11M3} + S_{11M1}S_{11M2})/$$

$$\{(2S_{11M2} - 2S_{11M1})S_{11M4} + (2S_{11M1} - 2S_{11M2})S_{11M3})]^{1/L1}$$

[Eq. 9]

When the ratio of $L_1:L_2:L_3$ does not satisfy either of the above conditions, an equation for obtaining $\xi$ is not explicitly derived herein. In such a case, a similar equation may be derived as needed, or $\xi$ may be obtained by iterative calculations.

When $\xi$ is obtained by equation 8 or 9, the values $\Gamma_{A2}$ and $\Gamma_{A3}$ can be calculated by equations 5 and 6. Thus, the error parameters can be successively obtained, which will be described subsequently.

—Calculation of Error Parameters of Error Model of RRR Calibration—

Figure 7:
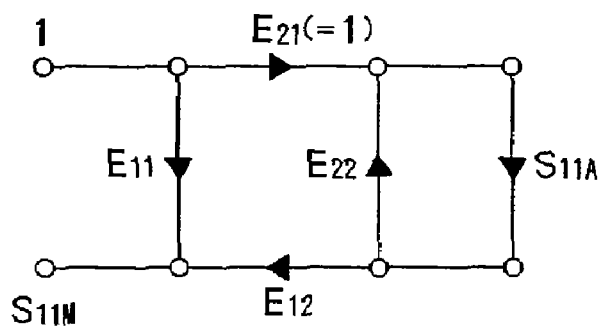
FIG. 7 is a diagram of an error model for use in the RRR calibration.

FIG. 7 shows an error model of RRR calibration. A reflection method is a technique for observing the level of a reflected portion of an electromagnetic wave entering a test object 17 from one port (connector 11b) and obtaining the impedance or the like on the basis of the observation. Since there is only one port, as shown in FIG. 7, there are only four error factors $E_{11}$, $E_{21}$, $E_{12}$, and $E_{22}$. Since the scattering parameter measurement is the ratio measurement, given $E_{21}=1$, then there are only three error factors $E_{11}$, $E_{12}$, and $E_{22}$. In the diagram, $S_{11M}$ is a measured value of the reflection parameter, and $S_{11A}$ is a true value of the reflection parameter.

On the basis of the measurement results obtained by connecting the short standard 10 in the above described manner, the error parameters $E_{11}$, $E_{12}$, and $E_{22}$ in FIG. 7 are obtained using equations 10, where $D_1$ is an intermediate variable:

$$D_1 = \Gamma_{A2}\Gamma_{A3}S_{11M3} - \Gamma_{A1}\Gamma_{A3}S_{11M3} - \Gamma_{A2}\Gamma_{A3}S_{11M2} +$$

$$\Gamma_{A1}\Gamma_{A2}S_{11M2} + \Gamma_{A1}\Gamma_{A3}S_{11M1} + \Gamma_{A1}\Gamma_{A2}S_{11M1}$$

$$E_{11} = -(\Gamma_{A1}\Gamma_{A3}S_{11M2}S_{11M3} - \Gamma_{A1}\Gamma_{A2}S_{11M2}S_{11M3} -$$

$$\Gamma_{A2}\Gamma_{A3}S_{11M1}S_{11M3} + \Gamma_{A1}\Gamma_{A3}S_{11M1}S_{11M3} +$$

$$\Gamma_{A2}\Gamma_{A3}S_{11M1}S_{11M2} - \Gamma_{A1}\Gamma_{A3}S_{11M1}S_{11M2})/D_1$$

[Eq. 10]

-continued $$E_{12} = \frac{(\Gamma_{A2} - \Gamma_{A1})(\Gamma_{A3} - \Gamma_{A1})(\Gamma_{A3} - \Gamma_{A2})}{D_1^2}$$
$$(S_{11M2} - S_{11M1})(S_{11M3} - S_{11M1})(S_{11M3} - S_{11M2})$$

$$E_{22} = \frac{\Gamma_{A2}S_{11M3} - \Gamma_{A2}S_{11M3} - \Gamma_{A2}S_{11M2} +}{D_1}$$
$$\frac{\Gamma_{A1}S_{11M2} + \Gamma_{A3}S_{11M1} + \Gamma_{A2}S_{11M1}}{D_1}$$

—Measurement of Test Object and RRR Calibration—

Figure 8:
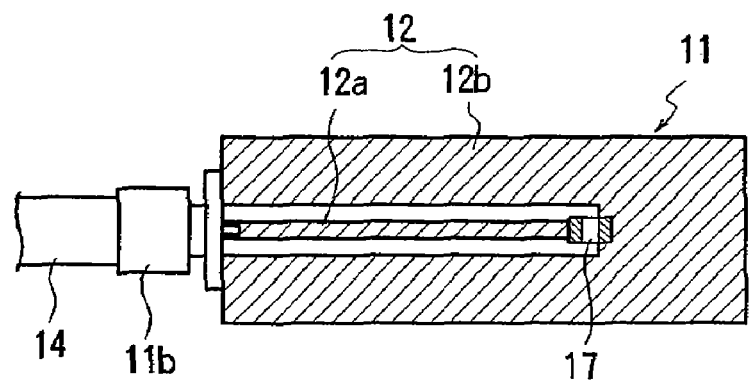
FIG. 8 includes plan views of the high-frequency electrical characteristic measuring apparatus according to the first embodiment, which is measuring a test object.

After the error parameters are obtained, as shown in FIG. 8, the test object 17 is connected between the signal conductor 12a and the ground conductor 12b, and electrical characteristics of the test object 17 are measured. For example, the test object 17 is picked up using a chip mounter or the like to bring the test object 17 into contact with the test object measuring position on the measuring fixture 11, and the reflection parameter ($S_{11M}$) is measured. Since the error model of RRR calibration is the same as that of TRL calibration, the effects of errors can be removed from the actual result of measuring the test object by performing a calculation similar to that in TRL calibration. An equation for removing the effects of errors and obtaining a true value of the reflection parameter $S_{11M}$ of the test object is given below. The equation for removing the effects of error factors is not limited to the equation below, and any known technique may be used.

$$S_{11A} = \frac{S_{11M} - E_{11}}{E_{22}S_{11M} + E_{12} - E_{11}E_{22}}$$

[Eq. 11]

Figure 9:
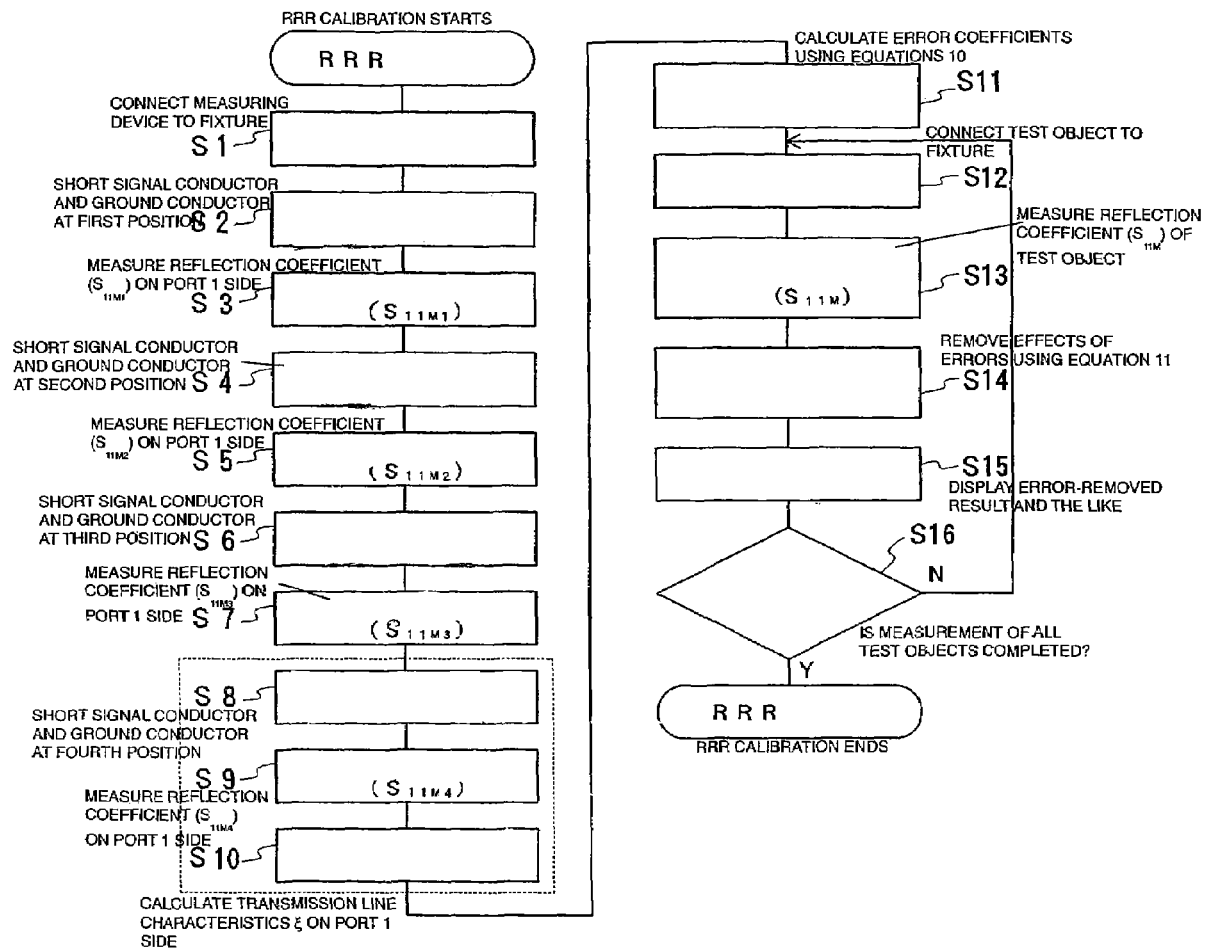
FIG. 9 is a flowchart of an example of the RRR calibration according to the first embodiment.

FIG. 9 is a flowchart of an example of an RRR calibration method.

When calibration starts, a measuring device is connected via a coaxial cable to a measuring fixture (step S1). Next, the signal conductor 12a and the ground conductor 12b are shorted by the short standard 10 at a first position, which is the open end of the signal conductor 12a (step S2). The first position may be in the vicinity of the test object measurement position or another position. While the short standard 10 is connected, the reflection parameter ($S_{11M1}$) on the port 1 side is measured (step S3).

Next, the signal conductor 12a and the ground conductor 12b are shorted by the short standard 10 at a second position (step S4), and the reflection parameter ($S_{11M2}$) on the port 1 side is measured (step S5). Next, the signal conductor 12a and the ground conductor 12b are shorted by the short standard 10 at a third position (step S6), and the reflection parameter ($S_{11M3}$) on the port 1 side is measured (step S7).

If the transmission line characteristics are unknown, the signal conductor 12a and the ground conductor 12c are again shorted by the short standard 10 at a fourth position (step S8), and the reflection parameter ($S_{11M4}$) of the port 1 is measured (step S9). On the basis of the reflection parameters, the transmission line characteristics $\xi$ on the port 1 side are calculated (step S10). When the transmission line characteristics $\xi$ are known, steps S8 to S10 are unnecessary.

Thereafter, the error parameters are calculated using the measured reflection parameters and transmission line characteristics $\xi$ and using equations 10 (step S11).

After the error parameters have been calculated, the test object is connected to the measuring fixture (step S12), and the reflection parameter ($S_{11M}$) of the test object is measured (step S13). Next, the effects of errors are removed from the measured value using equation 11 (step S14), and the error-removed result (true value of the test object) is displayed and the test object is selected (step S15). Thereafter, steps S12 to S15 are repeated until the measurement of all the test objects is completed (step S16). When the measurement of all the test objects is completed, the RRR calibration ends.

Figure 10:
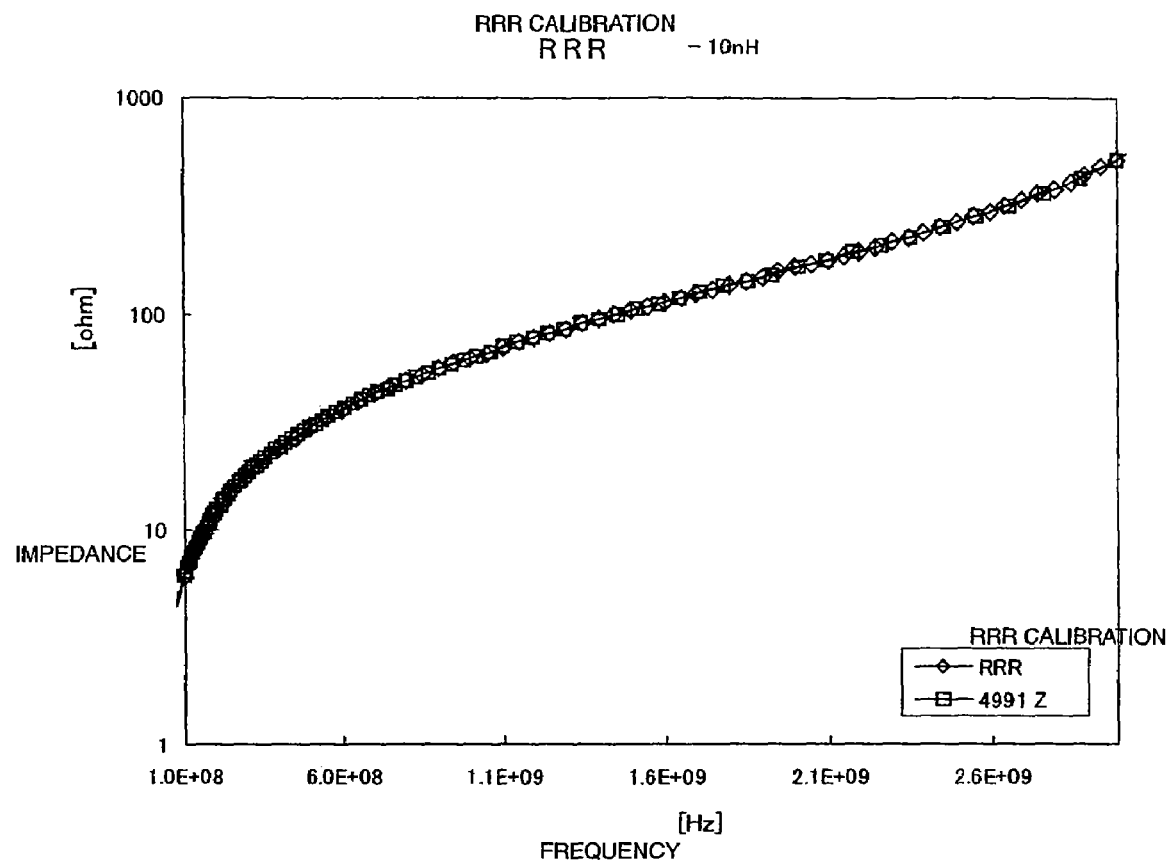
FIG. 10 is a diagram of high-frequency characteristics of a chip inductor measured using the RRR calibration.

FIG. 10 shows the results of measurement of a 10-nH chip inductor (laminated chip inductor) with a size of 1 mm×0.5 mm within the range from 1 GHz to 3 GHz using the RRR calibration.

Here, in addition to the RRR calibration, the measurement results obtained with a known impedance analyzer are shown. The impedance analyzer is the 4991A sold by Agilent Technologies Inc. The measurement results obtained with the RRR calibration trace those obtained with the known impedance analyzer. It is clear that the measurement with the RRR calibration has high accuracy.

Next, a description will be given of the manner in which the positions at which the short standard 10 is measured are selected.

For example, it is assumed that the short standard 10 is measured at the test object measurement point on the transmission line 12 and at a point 5 mm away from the test object measurement point. If the transmission line 12 has low loss, the only difference between the measurement results at the two points is the phase. Let the wavelength be 30 mm (the wavelength of a 1-GHz electromagnetic wave in a vacuum), and a difference of 5 mm in position corresponds to a difference of 10 mm in position in a round trip. Thus, it is expected that the measured data has a phase difference of (10 mm÷30 mm)×360°=120°. However, let the wavelength be 10 mm (the wavelength of a 3-GHz electromagnetic wave in a vacuum), and the same difference of 10 mm in position in a round trip generates a phase difference of 10 mm÷10 mm×360°=360°, and hence there will be no phase difference. With a difference of 5 mm in position, calibration cannot be performed properly at the frequency of the 10-mm wavelength.

In order to perform highly accurate calibration, it is preferable that pieces of calibration data be apart from each other as far as possible. In the RRR calibration where different pieces of calibration data are obtained depending on the reflection phase based on the short standard, it is preferable to adopt the condition where the phase difference between the positions at which the short standard is connected is between 70° and 145°.

The greater the phase difference between the calibration standards, the higher the accuracy of calibration. However, the frequency range that can be handled by a pair of calibration standards becomes narrow, and it thus becomes necessary to measure many calibration standards in order to perform broadband measurement. In the case of TRL calibration using the phase difference between calibration standards to perform calibration, as in the RRR calibration, it is preferable to have a phase difference of 20° to 30° or greater between calibration standards in order to achieve a satisfactory measurement accuracy.

In contrast, when the phase difference between the positions at which the short standard is connected is between 70° and 145°, although the calibration accuracy becomes high, the frequency range that can be handled by a pair of calibration standards becomes very narrow, compared with the above case. However, as will be described below, when the setting of the positions at which the short standard is connected is very easy, and when the measured data in the calibration is put to full use, the number of times the short standard is measured is not greatly increased, even in the case of broadband measurement, which thereby presents no practical problem.

First, the second position at which the short standard is measured, at which the phase at the upper limit measurement frequency is about 145°, is obtained. Specifically, the second position is obtained using the following equation:

$$L = \frac{145\pi}{180\beta} \qquad [\text{Eq. 12}]$$

where $\beta$[rad/mm] is a phase constant, and L [mm] is a position at which the short standard is measured.

Next, the third position at which the short standard is measured is set to 2L [mm], and the fourth position at which the short standard is measured is set to 4L [mm]. Similarly, the n-th position at which the short standard is measured is set to $2^{n-2}L$ [mm].

In the frequency band from the upper limit measurement frequency $f_{max}$ to $f_{max}/2$, the RRR calibration is performed using the results of measurements made at the first, second, and third positions at which the short standard is measured. In the frequency band from $f_{max}/2$ to $f_{max}/4$, the results of measurements made at the first, third, and fourth positions at which the short standard is measured are used. Similarly, in an n-th frequency band, namely, the frequency band from $f_{max}/2^{n-1}$ to $f_{max}/2^n$, the results of measurements made at the first, (n+1)-th, and (n+2)-th positions at which the short standard is measured are used. Accordingly, the phase difference between the positions at which the short standard is measured remains between 70° and 145°.

Embodiment 2

Figure 11:
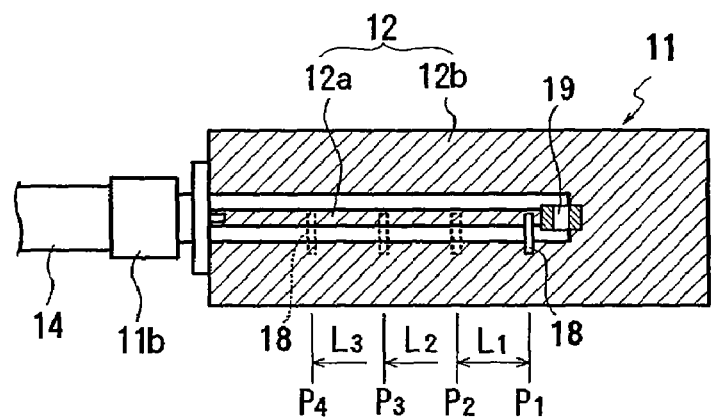
FIG. 11 is a plan view of the high-frequency electrical characteristic measuring apparatus showing a second embodiment of the RRR calibration according to the present invention.

FIG. 11 shows an example of a calibration method using a calibration standard different from the short standard. The measuring fixture 11 used here is the same as that of the first embodiment.

In the first embodiment, in order to perform calibration, the short standard 10 is employed to short across the signal conductor 12a and the ground conductor 12b. However, it is sufficient that the signal conductor 12a be connected to the ground conductor 12b so as to achieve some sort of a reflection state. A calibration standard 18 with a transmission parameter can be used instead of the short standard 10.

In this case, a terminating resistor 19 whose resistance is close to the characteristic impedance of the transmission line 12 is connected between the open end of the signal conductor 12a and the ground conductor 12b. Because of the terminating resistor 19, a so-called "matching" state is achieved, and a signal transmitted through the signal conductor 12a is not reflected but absorbed at the open end. In this state, the calibration standard 18 is connected to at least three points on the transmission line 12, thereby performing calibration. P1 to P4 are positions at which the calibration standard 18 is connected, and $L_1$ to $L_3$ are distances from the measurement point 1 to the measurement points 2 to 4, respectively.

The calibration standard 18 used here includes, instead of the short standard 10, a device with a transmission parameter (e.g., a chip resistor). In this case, part of a signal entering the signal conductor 12a passes through a portion in connection with the calibration standard 18 and reaches the open end of the signal conductor 12a. However, because of the terminating resistor 19, the signal is not reflected but rather is absorbed at the open end. Thus, even when a chip device whose transmission parameter is somewhat large is used as the calibration standard 18, errors are small, and high calibration accuracy can be achieved.

Embodiment 3

In the RRR calibration, error factors are removed only up to the tip of the fixture or the transmission line. For example, the effects of a stray admittance, contact resistance, residual inductance, or the like between the test object connection points are not eliminated. When it is considered that these have large effects, the effects can be alleviated by performing open/short calibration subsequent to the RRR calibration.

Figure 12:
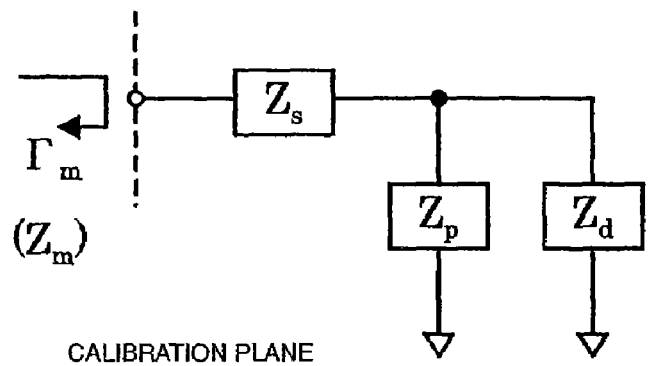
FIG. 12 is a model diagram of open/short calibration.

FIG. 12 shows a model of the open/short calibration. In the drawing, $\Gamma_m$ denotes an observed reflection parameter on the calibration plane, Zp denotes stray admittance, and Zs denotes residual impedance. Zd denotes the impedance of a test object. A reflection parameter generated due to the impedance of the test object is to be measured.

When the test object measurement point is open, it can be regarded that Zp>>Zs. The reflection parameter $\Gamma$p observed in this case is substantially determined by Zp. When the test object measurement point is shorted, it can be regarded that Zd<<Zp. The reflection parameter $\Gamma$s observed in this case is substantially determined by Zs. Using these, the reflection parameter generated by Zd is calculated using the following equation, which is an equation for performing open/short calibration:

$$\Gamma_d = -\frac{\Gamma_m\Gamma_p\Gamma_s - \Gamma_p\Gamma_s + \Gamma_m\Gamma_s + 3\Gamma_s - \Gamma_m\Gamma_p + \Gamma_p - 5\Gamma_m + 1}{\Gamma_m\Gamma_p\Gamma_s - 5\Gamma_p\Gamma_s + \Gamma_m\Gamma_s - \Gamma_m\Gamma_p + \Gamma_p - \Gamma_m + 1} \quad \text{[Eq. 13]}$$

In equation 13, it is assumed that the ideal open and shorted states are realized. Actually, the open/short calibration is relatively rough calibration. In many cases, it seems that a reduction in calibration accuracy due to this assumption will not be noticeable. For example, when the impedance of the calibration standard used for shorting the transmission line is known, this is taken into consideration to calculate $\Gamma_s$, thereby improving the calibration accuracy by calculating equation 13.

Embodiment 4

With the RRR calibration alone, errors of the entire measurement system can be corrected. In contrast, when the RRR calibration is performed after the coaxial cable connected to the measuring fixture is calibrated using the SOLT calibration or the like, the obtained error parameters are error parameters of the fixture board. That is, the RRR calibration can be used as a method for identifying the error factors of the fixture.

Recent network analyzers are equipped with a function (de-embedding function) for automatically removing the effects of given errors from the measurement results when the error parameters of the fixture or the like are given. Since there is no method to obtain errors of the fixture, this function is not actually often used. However, when this function is combined with the RRR calibration according to the present invention, this function becomes a very convenient function.

De-embedding is a technique for mathematically removing known error factors and is easily implemented using a transfer matrix. A scattering parameter matrix of the obtained error factors of the fixture are converted into a transfer matrix, and an inverse matrix of the transfer matrix is calculated. Let $E^{-1}$ be the inverse matrix of the transfer matrix, and let E be the transfer matrix of the error factors of the fixture. Further, let A be a transfer matrix of a device. The results of measuring the device including the fixture using the network analyzer calibrated up to the tip of the coaxial cable include errors at each port superimposed onto the characteristics of the device, and hence $$E \cdot A$$

is supposed to have been measured. This is multiplied by $E^{-1}$ and $F^{-1}$ from the left and right hand sides:

$$E^{-1} \cdot E \cdot A = A$$

Thus, the characteristics of the device are obtained.

With the de-embedding technique, the RRR calibration procedure requiring the highly accurate positioning of the calibration standard or the like is performed in a laboratory environment to determine error factors of each fixture with high accuracy. In a mass production step, devices can be mass-produced using a fixture whose error factors are already known. Needless to say, the errors of the fixture are removed by de-embedding the error factors obtained in the laboratory.

Accordingly, the RRR method can be exercised without preparing means for positioning the calibration standard with high accuracy in each process. This is advantageous in terms of cost and production control.

Embodiment 5

The measuring device is equipped with a computer and dedicated software. When the residual inductance of the calibration standard, parameters (phase constant β[rad/mm] and transmission loss δ[dB/Hz]) of the transmission line, and the contact positions of the calibration standard are input, the computer automatically calculates the calibration standard characteristics at each position on the basis of equations 1 and 2, which can be used in calibration calculations using equations 10 to 12. In short, the network analyzer is enabled to automatically estimate the values of the calibration standard and perform RRR calibration.

In a device inspection process performed at a mass production factory, an operator or the like need not calculate the values of the calibration standard, and the RRR calibration can be performed with the measuring device alone. Thus, the process can be simplified.

Embodiment 6

The residual inductance of the calibration standard (e.g., short standard) may have a large influence due to high frequencies, and, even when the shorted calibration standard (short standard) is connected to the transmission line, the transmission line may not be sufficiently shorted (no total reflection is achieved).

Figure 13:
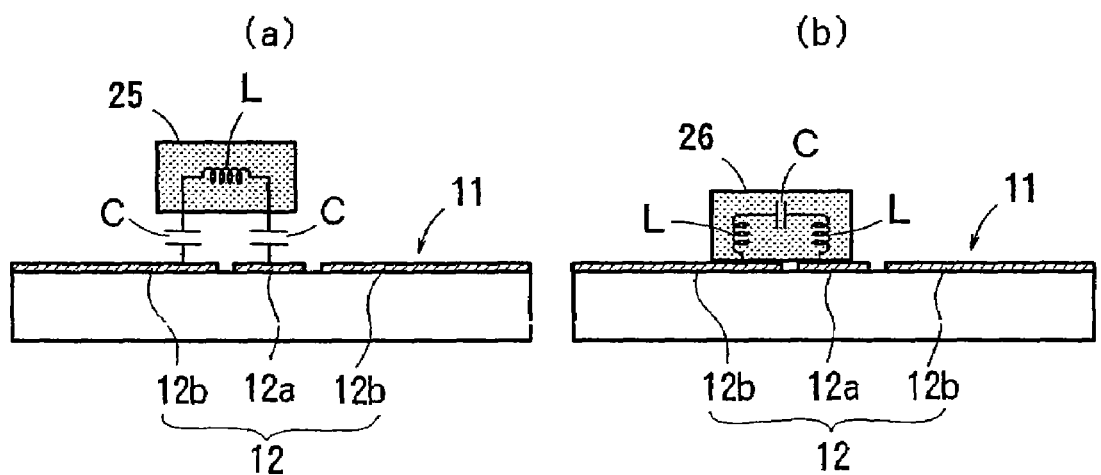
FIG. 13 includes views showing examples in which series resonance is produced between a calibration standard and a transmission line.

In this case, as shown in portion (a) of FIG. 13, it is preferable that a calibration standard 25 be placed above the transmission line 12 with a space therebetween, and that the capacitance C[F] generated between the transmission line and the calibration standard and the residual inductance L[H] of the calibration standard be in a series resonance state. In this case, it is set to satisfy $C=1/(2\pi f_s\sqrt{L})$.

Instead of using the stray capacitance between the calibration standard and the transmission line, as shown in portion (b) of FIG. 13, a calibration standard 26 may be placed in contact with the transmission line 12, thereby producing series resonance. In this case, the calibration standard 26 may be a capacitor with a very small capacitance.

In the series resonance state, the impedance of a portion in contact with the calibration standard is 0Ω, that is, an ideal short-circuited state is achieved. In other words, even at high frequencies where a satisfactory short standard is not obtained, the same advantage as that of using a satisfactory short standard can be achieved.

Embodiment 7

Figure 14:
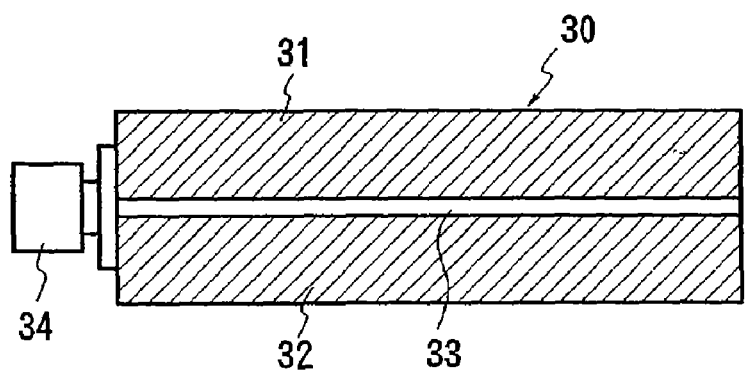
FIG. 14 is a plan view showing an example of another transmission line that can be used in a high-frequency electrical characteristic measuring method according to an embodiment of the present invention.

In the above embodiments, the cases in which the coplanar waveguide is used as the transmission line have been described. Alternatively, as shown in FIG. 14, a slot line 30 may be used. The slot line 30 includes a signal conductor 31 and a ground conductor 32, which are disposed on the same plane on a fixture board 33 with a space therebetween. A connector 34 is disposed at a first end of the fixture board 33. In this case, a test object is connected between the signal conductor 31 and the ground conductor 32, and electrical characteristics are measured.

The high-frequency electrical characteristic measuring method according to the present invention is not limited to the above embodiments.

The measuring device of the present invention is not limited to the network analyzer. Any device that can measure high-frequency electrical characteristics can be used as the measuring device.

Although the calibration standard is measured at the test object measurement position, the calibration standard need not be measured at the test object measurement position. In this case, three or more measurements of the calibration standard are all expressed using equation 1.

The transmission line is not limited to the planar transmission line. A transmission line with an arbitrary structure can be used as long as the calibration standard can be connected thereto and the test object can be connected between the signal conductor and the ground conductor.

As has been described above, a high-frequency electrical characteristic measuring method according to the present invention has the following advantages.

(1) Since a transmission line for use in calibration is the same as a transmission line for use in measuring a test object, the method is less likely to be influenced by variations of the transmission line. Connections between the transmission line and a measuring device are fixed in calibration and in the actual measurement, and there is no need to establish a reconnection. There will be no calibration failures or the like due to poor contact with the transmission line or the like.

(2) Highly accurate measurement of characteristics of a test object alone can be performed, without being influenced by errors of a fixture or the like. With a high-frequency electrical characteristic measuring apparatus, the present invention provides a method highly effective in accurately measuring scattering parameters or the impedance of a two-terminal impedance device, such as a chip inductor or a chip capacitor, or of a device, such as an antenna.

(3) Since the method according to the present invention is a calibration method using a reflection method, it is sufficient for the measuring device to have one port. Such a measuring device is inexpensive, and the calibration operation is simple.

Although the present invention has been described in relation to particular embodiments thereof, many other variations and modifications and other uses will become apparent to those skilled in the art. Therefore, the present invention is not limited by the specific disclosure herein.

What is claimed is:

1. A method for measuring high-frequency characteristics of an electronic device, the method comprising the steps of:
preparing a transmission line whose electrical characteristics per unit length are known, the transmission line including a signal conductor whose first end is an open end, and a ground conductor;
connecting a second end of the signal conductor and the ground conductor to associated measurement ports of a measuring device;
measuring, at at least three points in the longitudinal direction of the signal conductor, an electrical characteristic in a connection state where the signal conductor is connected to the ground conductor;
obtaining error factors of a measurement system including the transmission line on the basis of measured values in the connection state and the electrical characteristics of the transmission line;
connecting the electronic device to be measured between the open end of the signal conductor and the ground conductor and measuring an electrical characteristic; and
removing the error factors of the measurement system from a measured value of the electronic device to be measured and obtaining a true value of the electrical characteristic of the electronic device to be measured.

2. A method for measuring high-frequency characteristics of an electronic device, the method comprising the steps of:
preparing a transmission line whose electrical characteristics per unit length are unknown, the transmission line including a signal conductor whose first end is an open end, and a ground conductor;
connecting a second end of the signal conductor and the ground conductor to associated measurement ports of a measuring device;
measuring, at least four points in the longitudinal direction of the signal conductor, an electrical characteristic in a connection state where the signal conductor is connected to the ground conductor;

obtaining error factors of a measurement system including the transmission line and the electrical characteristics of the transmission line on the basis of measured values in the connection state;

connecting the electronic device to be measured between the open end of the signal conductor and the ground conductor and measuring an electrical characteristic; and removing the error factors of the measurement system from a measured value of the electronic device to be measured and obtaining a true value of the electrical characteristic of the electronic device to be measured.

3. The high-frequency electrical characteristic measuring method according to claim 1 or 2, wherein a short standard is brought into contact with the signal conductor and the ground conductor in order to connect the signal conductor to the ground conductor.

4. The high-frequency electrical characteristic measuring method according to claim 1 or 2, wherein the step of measuring the electrical characteristic in the connection state where the signal conductor is connected to the ground conductor is performed in a state where a terminating resistor whose resistance is close to a characteristic impedance of the transmission line is connected between the signal conductor and the ground conductor.

5. The high-frequency electrical characteristic measuring method according to claim 1 or 2, wherein a calibration standard is brought into contact or near contact with the signal conductor and the ground conductor in order to connect the signal conductor to the ground conductor, and series resonance is produced between capacitance of the calibration standard or capacitance between the calibration standard and the transmission line and residual inductance of the calibration standard.

6. The high-frequency electrical characteristic measuring method according to claim 1 or 2, wherein the step of obtaining the error factors of the measurement system including the transmission line is executed using the following equations:

$$D_1 = \Gamma_{A2}\Gamma_{A3}S_{11M3} - \quad [\text{Eq. 10}]$$

$$\Gamma_{A1}\Gamma_{A3}S_{11M3} - \Gamma_{A2}\Gamma_{A3}S_{11M2} - \Gamma_{A1}\Gamma_{A2}S_{11M1} +$$

$$\Gamma_{A1}\Gamma_{A2}S_{11M2} + \Gamma_{A1}\Gamma_{A3}S_{11M1} - \Gamma_{A1}\Gamma_{A2}S_{11M1}$$

$$E_{11} = (\Gamma_{A1}\Gamma_{A3}S_{11M2}S_{11M3} - \Gamma_{A1}\Gamma_{A2}S_{11M2}S_{11M3} -$$

$$\Gamma_{A2}\Gamma_{A3}S_{11M1}S_{11M3} + \Gamma_{A1}\Gamma_{A3}S_{11M1}S_{11M3} +$$

$$\Gamma_{A2}\Gamma_{A3}S_{11M1}S_{11M2} - \Gamma_{A1}\Gamma_{A3}S_{11M1}S_{11M2})/D_1$$

$$E_{12} = \frac{(\Gamma_{A2} - \Gamma_{A1})(\Gamma_{A3} - \Gamma_{A1})(\Gamma_{A3} - \Gamma_{A2})(S_{11M2} - S_{11M1})(S_{11M3} - S_{11M1})(S_{11M3} - S_{11M2})}{D_1^2}$$

$$E_{22} = \frac{\Gamma_{A2}S_{11M3} - \Gamma_{A1}S_{11M3} - \Gamma_{A3}S_{11M2} + \Gamma_{A2}S_{11M3} + \Gamma_{A2}S_{11M1} + \Gamma_{A2}S_{11M1}}{D_1}$$

where $\Gamma_{A1}$ is a reflection parameter at a first measurement position, $\Gamma_{A2}$ is a reflection parameter at a second measurement position, $\Gamma_{A3}$ is a reflection parameter at a third measurement position, $S_{11M1}$ is a measured value at the first measurement position, $S_{11M2}$ is a measured value at the second measurement position, $S_{11M3}$ is a measured value at the third measurement position, and $E_{11}$, $E_{12}$, and $E_{22}$ are the error factors of the measurement system.

7. The high-frequency electrical characteristic measuring method according to claim 6, wherein the step of removing the error factors of the measurement system from the measured value of the electronic device to be measured and obtaining the true value of the electrical characteristic of the electronic device to be measured is executed using the following equation:

$$S_{11A} = \frac{S_{11M} - E_{11}}{E_{22}S_{11M} + E_{12} - E_{11}E_{22}} \quad [\text{Eq. 11}]$$

where $S_{11A}$ is a reflection parameter of the electronic device to be measured.

8. The high-frequency electrical characteristic measuring method according to claim 1 or 2, wherein the transmission line includes the signal conductor and the ground conductor disposed on the same plane.

9. The high-frequency electrical characteristic measuring method according to claim 8, wherein the transmission line is a coplanar waveguide including the signal conductor, and the ground conductor disposed so as to surround two sides and the open end of the signal conductor.

10. The high-frequency electrical characteristic measuring method according to claim 8, wherein the transmission line is a slot line including the signal conductor and the ground conductor disposed with a space therebetween.

11. The high-frequency electrical characteristic measuring method according to claim 1 or 2, wherein each position at which the electrical characteristic is measured in a state where the signal conductor and the ground conductor are shorted is a position at which a phase difference between the positions is between 70° and 145°.

12. An apparatus for measuring high-frequency characteristics of an electronic device, the apparatus comprising:

a transmission line whose electrical characteristics per unit length are known, the transmission line including a signal conductor whose first end is an open end and a ground conductor;

a measuring device that can measure high-frequency electrical characteristics, the measuring device including a measurement port connected to a second end of the signal conductor and a measurement port connected to the ground conductor;

means for establishing a connection state where the signal conductor is connected to the ground conductor at least three points in the longitudinal direction of the signal conductor;

means for obtaining error factors of a measurement system including the transmission line on the basis of measured values in the connection state and the electrical characteristics of the transmission line;

means for connecting the electronic device to be measured between the open end of the signal conductor and the ground conductor; and means for removing the error factors of the measurement system from a measured value obtained by connecting the electronic device to be measured between the open end of the signal conductor and the ground conductor and obtaining a true value of the electrical characteristic of the electronic device to be measured.

13. An apparatus for measuring high-frequency characteristics of an electronic device, the apparatus comprising:

a transmission line whose electrical characteristics per unit length are unknown, the transmission line including a signal conductor whose first end is an open end and a ground conductor;

a measuring device that can measure high-frequency electrical characteristics, the measuring device including a measurement port connected to a second end of the signal conductor and a measurement port connected to the ground conductor;

means for establishing a connection state where the signal conductor is connected to the ground conductor at least four points in the longitudinal direction of the signal conductor;

means for obtaining error factors of a measurement system including the transmission line and the electrical characteristics of the transmission line on the basis of measured values in the connection state;

means for connecting the electronic device to be measured between the open end of the signal conductor and the ground conductor; and means for removing the error factors of the measurement system from a measured value obtained by connecting the electronic device to be measured between the open end of the signal conductor and the ground conductor and obtaining a true value of the electrical characteristic of the electronic device to be measured.

14. A method for calibrating an apparatus for measuring high-frequency electrical characteristics of an electronic device, the method comprising the steps of:

preparing a transmission line whose electrical characteristics per unit length are known, the transmission line including a signal conductor whose first end is an open end, and a ground conductor;

connecting a second end of the signal conductor and the ground conductor to associated measurement ports of a measuring device;

measuring, at least three points in the longitudinal direction of the signal conductor, an electrical characteristic in a connection state where the signal conductor is connected to the ground conductor; and obtaining error factors of a measurement system including the transmission line on the basis of measured values in the connection state and the electrical characteristics of the transmission line.

15. A method for calibrating an apparatus for measuring high-frequency electrical characteristics of an electronic device, the method comprising the steps of:

preparing a transmission line whose electrical characteristics per unit length are unknown, the transmission line including a signal conductor whose first end is an open end, and a ground conductor;

connecting a second end of the signal conductor and the ground conductor to associated measurement ports of a measuring device;

measuring, at least four points in the longitudinal direction of the signal conductor, an electrical characteristic in a connection state where the signal conductor is connected to the ground conductor; and obtaining error factors of a measurement system including the transmission line and the electrical characteristics of the transmission line on the basis of measured values in the connection state.

* * * * *